United States Patent
Sugisawa (10) Patent No.: US 10,654,428 B2
(45) Date of Patent: May 19, 2020

(54) POWER SUPPLY CONTROL DEVICE

(71) Applicants: AUTONETWORKS TECHNOLOGIES, LTD., Yokkaichi-shi, Mie (JP); SUMITOMO WIRING SYSTEMS, LTD., Yokkaichi-shi, Mie (JP); SUMITOMO ELECTRIC INDUSTRIES, LTD., Osaka-shi, Osaka (JP)

(72) Inventor: Yuuki Sugisawa, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 205 days.

(21) Appl. No.: 16/064,652

(22) PCT Filed: Nov. 11, 2017

(86) PCT No.: PCT/JP2017/000600
§ 371 (c)(1),
(2) Date: Jun. 21, 2018

(87) PCT Pub. No.: WO2017/122664
PCT Pub. Date: Jul. 20, 2017

(65) Prior Publication Data
US 2018/0370464 A1    Dec. 27, 2018

(30) Foreign Application Priority Data

Jan. 14, 2016    (JP) ................................. 2016-005557

(51) Int. Cl.
*H02H 5/00*    (2006.01)
*B60R 16/03*    (2006.01)
(Continued)

(52) U.S. Cl.
CPC ............. *B60R 16/03* (2013.01); *H02H 5/105* (2013.01); *H02J 1/00* (2013.01); *H02J 1/08* (2013.01);
(Continued)

(58) Field of Classification Search
CPC ................................. B60R 16/03; H02H 5/105
(Continued)

(56) References Cited

U.S. PATENT DOCUMENTS

2009/0096293 A1    4/2009    Nakayama et al.
2015/0102672 A1    4/2015    Matsumoto et al.

FOREIGN PATENT DOCUMENTS

| JP | 2009-065756 A | 3/2009 |
| JP | 4473294 B2 | 6/2010 |
| JP | 2015-077818 A | 4/2015 |

OTHER PUBLICATIONS

Apr. 4, 2017 International Search Report issued in International Patent Application No. PCT/JP2017/000600.

*Primary Examiner* — Adi Amrany
(74) *Attorney, Agent, or Firm* — Oliff PLC (57) ABSTRACT

A power supply control device that includes a switch control unit that is configured to switch on and off a first switch and a second switch and receive a supply of power from a battery, the first switch and the second switch being respectively provided in a plurality of power supply paths through which power is supplied from one end of a battery to one end of a first load and one end of a second load; an output terminal from which current that flows from the battery via the switch control unit is output; a diode whose anode is connected to the output terminal, and whose cathode is connected to one end of the second load; an opening detection circuit; and a voltage detection circuit.

6 Claims, 5 Drawing Sheets

(51) Int. Cl.
*H02J 1/08* (2006.01)
*H02H 5/10* (2006.01)
*H02J 1/00* (2006.01)
*H02M 3/156* (2006.01)
*H03K 17/16* (2006.01)
*H03K 17/567* (2006.01)
*H03K 17/74* (2006.01)
*H02J 7/00* (2006.01)

(52) U.S. Cl.
CPC .......... H02M 3/156 (2013.01); H03K 17/162 (2013.01); H03K 17/567 (2013.01); H03K 17/74 (2013.01); *H02J 7/0063* (2013.01)

(58) Field of Classification Search
USPC .................................. 307/9.1, 10.1, 12, 113
See application file for complete search history.

POWER SUPPLY CONTROL DEVICE

This application is the U.S. National Phase of PCT/JP2017/000600 filed Jan. 11, 2017, which claims priority to Japanese Patent Application No. 2016-005557 filed on Jan. 14, 2016, the entire contents of which are incorporated herein by reference.

BACKGROUND

The present disclosure relates to a power supply control device configured to control the supply of power from a battery to a load.

A power supply control device configured to control the supply of power from a battery to a load is installed in vehicles (e.g., see Japanese Patent 4473294). In the power supply control device disclosed in Japanese Patent 4473294, a switch is connected between the positive electrode of a battery and one end of a load, and the negative electrode of the battery and the other end of the load are grounded. The power supply control device disclosed in Japanese Patent 4473294 includes a switch control unit configured to switch the switch on and off. The switch control unit controls the supply of power from the battery to the load by switching the switch on and off.

The switch control unit is also connected to the positive electrode of the battery, and the switch control unit receives a supply of power from the battery. At this time, current flows from the positive electrode of the battery to an output terminal via the switch control unit. The output terminal is grounded, and current that flows from the output terminal returns to the grounded negative electrode of the battery.

In the power supply control device disclosed in Japanese Patent 4473294, an anode is connected to the output terminal and a cathode further includes a diode connected to the one end of the load. Thus, for example, in a case where an electrical wire that is used for grounding the output terminal is disconnected and the output terminal is opened, when the switch is off, current flows from the positive electrode of the battery to the switch control unit, the diode, and the load in this order, current returns to the negative electrode of the battery, and the supply of power from the battery to the switch control unit continues.

After the output terminal is opened, the switch control unit performs other control in a state in which the switch is kept off. For example, the switch control unit controls the supply of power from the battery to another load by switching the switch on and off, the switch being provided in a power supply path through which power is supplied from the battery to the other load.

SUMMARY

However, a signal indicating whether or not the output terminal has been opened is not input to the switch control unit of the power supply control device disclosed in Japanese Patent 4473294, which is problematic in that the switch control unit cannot keep the switch off at an appropriate time. Although the output terminal is open, if the switch control unit switches the switch from off to on, then the battery cannot supply power to the switch control unit and the operation of the switch control unit stops.

An exemplary aspect of the disclosure provides a power supply control device in which a switch is kept off at an appropriate time.

A power supply control device according to the present disclosure is a power supply control device including a switch control unit that is configured to switch on and off a first switch and a second switch and receive a supply of power from a battery, the first switch and the second switch being respectively provided in a plurality of power supply paths through which power is supplied from one end of a battery to one end of a first load and one end of a second load; an output terminal from which current that flows from the battery via the switch control unit is output; a diode whose anode is connected to the output terminal, and whose cathode is connected to one end of the second load; an opening detection circuit configured to not detect opening of the output terminal if the second switch is on, and configured to operate if the second switch is off and detect opening of the output terminal; and a voltage detection circuit configured to detect a voltage between one end of the battery and the output terminal, in which the switch control unit switches off the second switch if the voltage detected by the voltage detection circuit is less than a threshold value, and keeps the second switch off if the opening detection circuit detects the opening.

According to the present disclosure, if the output terminal is opened in a state in which the second switch is off, current flows from one end of the battery to the switch control unit, the diode, and the second load in this order, and returns to the other end of the battery, and power is supplied to the switch control unit. The switch control unit keeps the second switch off at an appropriate time at which the opening detection circuit detects the opening of the output terminal. Thereafter, the switch control unit switches the first switch on and off in a state in which the second switch is kept off, and controls supply of power from the battery to the first load.

If the second switch is on, the opening detection circuit does not detect the opening of the output terminal. If the output terminal is opened in a state in which the second switch is on, the supply of power from the battery to the switch control unit stops, and thus the potential of the output terminal increases, and the voltage between the one end of the battery and the output terminal decreases. If the voltage between the one end of the battery and the output terminal is less than a threshold value, the switch control unit switches off the second switch. When the output terminal is opened and the switch control unit switches the second switch off, current flows from the one end of the battery to the switch control unit, the diode, and the second load in this order, and returns to the other end of the battery. Accordingly, the supply of power from the battery to a microcomputer is resumed. At this time, the second switch is switched off, and thus the opening detection circuit detects the opening of the output terminal and the switch control unit keeps the second switch off.

In the power supply control device according to the present disclosure, the opening detection circuit has a resistor having one end to which a predetermined voltage is applied; and a third switch that is connected between another end of the resistor and the anode of the diode, and that is switched on from off if current flows through the diode, and a voltage is output from the other end of the resistor to the switch control unit.

In the present disclosure, the output terminal is not open or the second switch is on, and thus if no current flows through the diode, then the third switch is off, and a predetermined voltage is output from the other end of the resistor to the switch control unit. If the output terminal is open in a state in which the second switch is off, current flows through the diode, the third switch is turned on, and a voltage that is lower than a predetermined voltage is output from the other end of the resistor to the switch control unit. If this voltage is input to the switch control unit, the switch control unit keeps the second switch off.

In the power supply control device according to the present disclosure, if a state in which the voltage detected by the voltage detection circuit is less than the threshold value continues for at least a predetermined period of time, then the switch control unit switches off the second switch.

According to the present disclosure, if the voltage detection circuit continues to detect a voltage that is less than the threshold value for at least a predetermined period of time, that is, if there is a high probability that the output terminal is open, then the second switch is switched off and the supply of power to the second load is stopped. Accordingly, the switch control unit more appropriately controls the supply of power from a battery 2 to the second load.

The power supply control device according to the present disclosure includes an accumulator configured to accumulate power supplied by the battery, in which, if the output terminal is opened in a state in which the second switch is on, then the accumulator supplies power to the switch control unit.

According to the present disclosure, if the output terminal is opened in a state in which the second switch is on, the supply of power from the battery to the switch control unit stops, and thus the supply of power from the accumulator to the switch control unit is started. Thus, even though the output terminal is opened in a state in which the second switch is on, the switch control unit can continue to switch the first switch and the second switch on and off.

In the power supply control device according to the present disclosure, if the opening is not detected, a voltage that is at least a second predetermined voltage is output to the switch control unit from the other end of the resistor of the opening detection circuit, and if the opening is detected, a voltage that is less than the second predetermined voltage is output to the switch control unit from the other end of the resistor of the opening detection circuit.

According to the present disclosure, the voltage that is output to the switch control unit from the other end of the resistor of the opening detection circuit is less than the second predetermined voltage if the opening of the output terminal is detected.

In the power supply control device according to the present disclosure, after the opening detection circuit detects the opening, the switch control unit switches the first switch on and off in a state in which the second switch is kept off.

According to the present disclosure, after the opening detection circuit detects the opening of the output terminal, the switch control unit switches the first switch on and off in a state in which the second switch is kept off.

Advantageous Effects of Disclosure

According to the present disclosure, the second switch is kept off at an appropriate time.

DETAILED DESCRIPTION OF EMBODIMENTS

Hereinafter, the present disclosure will be described in detail with reference to the drawings showing an embodiment.

Figure 1:
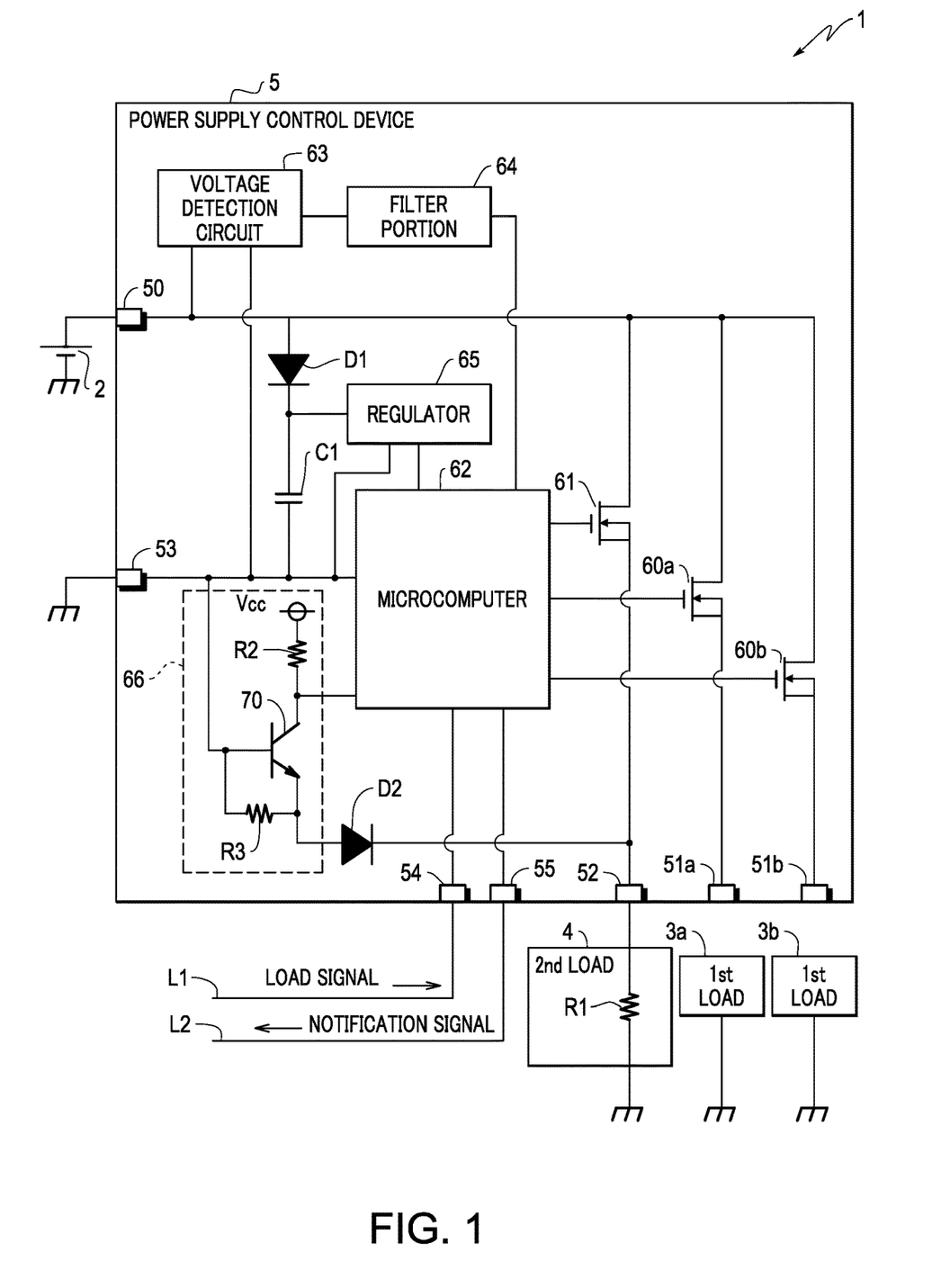
FIG. 1 is a block diagram showing the configuration of the main portions of a power source system in this embodiment.

FIG. 1 is a block diagram showing the configuration of the main portions of a power source system 1 in the present embodiment. The power source system 1 is suitably installed in a vehicle, and includes a battery 2, first loads 3a and 3b, a second load 4, and a power supply control device 5.

The first loads 3a and 3b are important electric devices that the driver needs to drive the vehicle. The second load 4 is an electric device that is not necessarily needed by the driver to drive the vehicle, such as a defogger, and the second load 4 has a resistor R1. The resistor R1 is a resistor of a heating wire that is part of the defogger, for example.

The power supply control device 5 has a battery terminal 50, first load terminals 51a and 51b, a second load terminal 52, a GND terminal 53, and signal terminals 54 and 55. A positive electrode of the battery 2 is connected to the battery terminal 50. One end of the first load 3a is connected to the first load terminal 51a and one end of the first load 3b is connected to the first load terminal 51b. One end of the resistor R1 of the second load 4 is connected to the second load terminal 52. A negative electrode of the battery 2, the other ends of the first loads 3a and 3b, the other end of the resistor R1 of the second load 4, and the GND terminal 53 are grounded. Signal wires L1 and L2 are respectively connected to the signal terminals 54 and 55.

The battery 2 supplies power to the first loads 3a and 3b and the second load 4 via the power supply control device 5, and also supplies power to the power supply control device 5. Current is input from the positive electrode of the battery 2 to the battery terminal 50, current is output from at least one of the first load terminals 51a and 51b, the second load terminal 52, and the GND terminal 53 while the battery 2 supplies power.

The signal terminal 54 of the power supply control device 5 receives a load signal that indicates which of the first loads 3a and 3b and the second load 4 is to be operated, and which is to be stopped, via the signal wire L1. The power supply control device 5 controls the supply of power from the battery 2 to the first loads 3a and 3b and the second load 4 based on the content of the load signal received by the signal terminal 54. Also, the power supply control device 5 outputs a notification signal for notification from the signal terminal 55 via the signal wire L2.

The power supply control device 5 further includes first switches 60a and 60b, a second switch 61, a microcomputer 62, a voltage detection circuit 63, a filter portion 64, a regulator 65, an opening detection circuit 66, a capacitor C1, and diodes D1 and D2. The opening detection circuit 66 has a third switch 70 and resistors R2 and R3. The first switches 60a and 60b and the second switch 61 are each an N-channel FET (Field Effect Transistor). The third switch 70 is an NPN bipolar transistor.

The battery terminal 50 is connected to drains of the first switches 60a and 60b and the second switch 61. Sources of the first switches 60a and 60b and the second switch 61 are respectively connected to the first load terminals 51a and 51b and the second load terminal 52. Gates of the first switches 60a and 60b and the second switch 61 are individually connected to the microcomputer 62.

The battery terminal 50 is further connected to a voltage detection circuit 63 and the anode of the diode D1. The voltage detection circuit 63 is further separately connected to the GND terminal 53 and a filter portion 64. The filter portion 64 is further connected to the microcomputer 62. The cathode of the diode D1 is connected to the regulator 65 and one end of the capacitor C1. The regulator 65 is further connected to the GND terminal 53 and the microcomputer 62. The microcomputer 62 and the other end of the capacitor C1 are connected to the GND terminal 53.

In the opening detection circuit 66, a predetermined voltage Vcc is applied to one end of the resistor R2. The predetermined voltage Vcc is a constant voltage taking the potential of the GND terminal 53 as a reference. The other end of the resistor R2 is connected to the microcomputer 62 and a collector of the third switch 70. A base of the third switch 70 is connected to the GND terminal 53 and one end of the resistor R3. An emitter of the third switch 70 is connected to the other end of the resistor R3 and the anode of the diode D2. A cathode of the diode D2 is connected to the second load terminal 52. The microcomputer 62 is further connected to the signal terminals 54 and the 55.

As described above, the anode of the diode D2 is connected to the GND terminal 53 via the resistor R3 of the opening detection circuit 66, and the cathode of the diode D2 is connected to one end of the resistor R1 of the second load 4 via the second load terminal 52. Also, the third switch 70 is connected between the other end of the resistor R2 and the anode of the diode D2.

The microcomputer 62 adjusts the voltages at the gates of the first switches 60a and 60b and the second switch 61 with reference to the potential of the GND terminal 53. If the microcomputer 62 adjusts the voltages at the gates of the first switches 60a and 60b and the second switch 61 to at least the given voltage individually, current can flow between the drains and sources. At this time, the first switches 60a and 60b and the second switch 61 are each on.

Also, if the microcomputer 62 adjusts the voltage at the gates of the first switches 60a and 60b and the second switch 61 to be less than the given voltage individually, no current flows between the drains and sources. At this time, the first switches 60a and 60b and the second switch 61 are off.

The first switches 60a and 60b and the second switch 61 are switched on and off individually by the microcomputer 62 adjusting the voltages at the gates of the first switches 60a and 60b and the second switch 61 individually. The microcomputer 62 functions as a switch control unit.

If the microcomputer 62 switches on the first switch 60a, then, power is supplied from the battery 2 to the first load 3a and the first load 3a operates. If the microcomputer 62 switches off the first switch 60a, the supply of power from the battery 2 to the first load 3a is stopped, and the first load 3a stops operating. Similarly to the first load 3a, the microcomputer 62 controls the supply of power to the first load 3b and the second load 4 by switching the first switch 60b and the second switch 61 on and off individually. Similarly to the first load 3a, when power is supplied to the first load 3b and the second load 4, the first load 3b and the second load 4 operate, and when power supply is stopped, the first load 3b and the second load 4 stop operating.

If the microcomputer 62 switches on the first switches 60a and 60b and the second switch 61, power is supplied from the battery 2 to the first loads 3a and 3b and the second load 4 via the first switches 60a and 60b and the second switch 61 individually. In this manner, in the power supply control device 5, three power supply paths through which power is supplied from the positive electrode of the battery 2 to one end of each of the first loads 3a and 3b and the second load 4 are respectively provided with the first switches 60a and 60b and the second switch 61.

The voltage detection circuit 63 detects a voltage between the battery terminal 50 connected to the positive electrode of the battery 2 and the GND terminal 53. If the detected detection voltage is greater than or equal to a preset threshold value, the voltage detection circuit 63 outputs a high-level voltage to the filter portion 64, and if the detection voltage is less than the threshold value, the voltage detection circuit 63 outputs a low-level voltage to the filter portion 64.

If the voltage input from the voltage detection circuit 63 is a high-level voltage, or if a time during which a low-level voltage is input from the voltage detection circuit 63 is less than a predetermined period of time, the filter portion 64 outputs the high-level voltage to the microcomputer 62. If the time during which the low-level voltage is input from the voltage detection circuit 63 is greater than or equal to the predetermined period of time, the filter portion 64 outputs the low-level voltage to the microcomputer 62.

For example, every time a set period that is set in advance elapses, the filter portion 64 determines whether or not the voltage input from the voltage detection circuit 63 is a low-level voltage. With this configuration, if the filter portion 64 determines that the voltage input from the voltage detection circuit 63 is a low-level voltage continuously for a predetermined number of times, the filter portion 64 outputs the low-level voltage to the microcomputer 62. The predetermined number of times is at least two. If the filter portion 64 determines that the voltage input from the voltage detection circuit 63 is a high-level voltage, or if the number of times for which it is continuously determined that the voltage input from the voltage detection circuit 63 is a low-level voltage is less than the predetermined number of times, the filter portion 64 outputs a high-level voltage to the microcomputer.

Power is supplied to the regulator 65 from the battery 2 or the capacitor C1. Furthermore, the regulator 65 generates a predetermined voltage based on the voltage input from the battery 2 or the capacitor C1, and outputs the generated predetermined voltage to the microcomputer 62. Accordingly, power is supplied to the microcomputer 62. The predetermined voltage that the regulator 65 outputs to the microcomputer 62 is a constant voltage taking the potential of the GND terminal 53 as a reference.

Note that the predetermined voltage Vcc that is applied to the one end of the resistor R2 may also be generated by the regulator 65.

If the GND terminal 53 is not open, that is, if the GND terminal 53 is grounded, current flows from the positive electrode of the battery 2 to the battery terminal 50, the diode D1, the regulator 65, the microcomputer 62, and the GND terminal 53 in this order, and current is output from the GND terminal 53. Current that is output from the GND terminal 53 returns to the negative electrode of the battery 2. Because current flows in this manner, power is supplied from the battery 2 to the microcomputer 62. The GND terminal 53 functions as the output terminal.

If the GND terminal 53 is grounded, current further flows from the positive electrode of the battery 2 to the battery terminal 50, the diode D1, the capacitor C1, and the GND terminal 53 in this order, and current returns to the negative electrode of the battery 2. Accordingly, the capacitor C1 accumulates power supplied by the battery 2. The capacitor C1 functions as an accumulator.

For example, even in the case where the GND terminal 53 is open due to disconnection of an electrical wire used to ground the GND terminal 53 and the second switch 61 is off, similarly to the case where the GND terminal 53 is grounded, current flows from the positive electrode of the battery 2 to the microcomputer 62 and the capacitor C1. Therefore, even in the case where the GND terminal 53 is open and the second switch 61 is off, power is supplied from the battery 2 to the microcomputer 62 via the regulator 65, and the capacitor C1 accumulates power supplied by the battery 2.

If the GND terminal 53 is open and the second switch 61 is off, current that is output from the microcomputer 62 and the other end of the capacitor C1 flows through the resistor R3 of the opening detection circuit 66, the diode D2, the second load terminal 52, and the resistor R1 of the second load 4 in this order.

If power having at least a predetermined power is supplied from the battery 2 to the second load 4, the second load 4 operates. If the GND terminal 53 is open and the second switch 61 is off, power that is supplied from the battery 2 to the second load 4 is less than the predetermined power, and the second load 4 does not operate.

If the GND terminal 53 is open and the second switch 61 is on, the power supply path through which power is supplied from the battery 2 to the microcomputer 62 and the power supply path through which power is supplied from the battery 2 to the capacitor C1 are not present, and the supply of power from the battery 2 to the microcomputer 62 and the capacitor C1 stops. At this time, the capacitor C1 discharges and supplies power to the regulator 65. As described above, the regulator 65 generates a predetermined voltage from the voltage input from the capacitor C1, and outputs the generated predetermined voltage to the microcomputer 62.

In this manner, if the GND terminal 53 is opened in a state in which the second switch 61 is on, the capacitor C1 supplies power to the microcomputer 62 via the regulator 65. While the capacitor C1 supplies power to the microcomputer 62, current flows from one end of the capacitor C1 to the regulator 65 and the microcomputer 62 in this order, and returns to the other end of the capacitor C1.

With regard to the third switch 70 of the opening detection circuit 66, if a base voltage taking the potential of the emitter as a reference is at least a given voltage, current can flow between the collector and the emitter. At this time, the third switch 70 is on. Also, with regard to the third switch 70, if the base voltage taking the potential of the emitter as a reference is less than the given voltage, no current flows between the collector and the emitter. At this time, the third switch 70 is off. Here, the given voltage is a positive voltage.

If the GND terminal 53 is grounded, or if the second switch 61 is on, no current flows through the resistor R3 of the opening detection circuit 66 and the diode D2. Thus, the voltage between the emitter of the third switch 70 and the base is approximately zero voltage, and the third switch 70 is off. If the third switch 70 is off, the predetermined voltage Vcc is output from the other end of the resistor R2 to the microcomputer 62.

As described above, if the GND terminal 53 is open in a state in which the second switch 61 is off, current that is output from the microcomputer 62, and the other end of the capacitor C1 flows through the resistor R3 of the opening detection circuit 66 and the diode D2. At this time, the voltage across the resistor R3 drops, and in the third switch 70, the base voltage, taking the potential of the emitter as a reference, is at least a given voltage. Accordingly, the third switch 70 is switched on from off. If the third switch 70 is on, current flows through the resistor R2, the third switch 70, and the diode D2 in this order, and a voltage that is lower than the predetermined voltage Vcc is output from the other end of the resistor R2 to the microcomputer 62.

The microcomputer 62 stores information indicating a reference voltage that exceeds the voltage that is input from the other end of the resistor R2 to the microcomputer 62 when the third switch 70 is on, and is not more than the predetermined voltage Vcc. When the voltage that is input from the other end of the resistor R2 is at least the reference voltage, the GND terminal 53 is grounded, and when the voltage that is input from the other end of the resistor R2 is less than the reference voltage, the GND terminal 53 is open. The reference voltage is constant and is set in advance.

As described above, the opening detection circuit 66 operates if the second switch 61 is off. If the GND terminal 53 is opened in a state in which the second switch 61 is off, the opening detection circuit 66 detects the opening of the GND terminal 53 and outputs, to the microcomputer 62, a voltage that is less than the reference voltage. If the second switch 61 is on, the opening detection circuit 66 does not operate and outputs the predetermined voltage Vcc to the microcomputer 62 regardless of whether or not the GND terminal 53 is open. Also, if the GND terminal 53 is grounded in a state in which the second switch 61 is off, the opening detection circuit 66 outputs the predetermined voltage Vcc to the microcomputer 62.

The microcomputer 62 switches the first switches 60*a* and 60*b* and the second switch 61 on and off based on the content indicated by the load signal that is input from the signal terminal 54 and the voltages that are input from the filter portion 64 and the opening detection circuit 66, and controls the supply of power to the first loads 3*a* and 3*b* and the second load 4.

Figure 2:
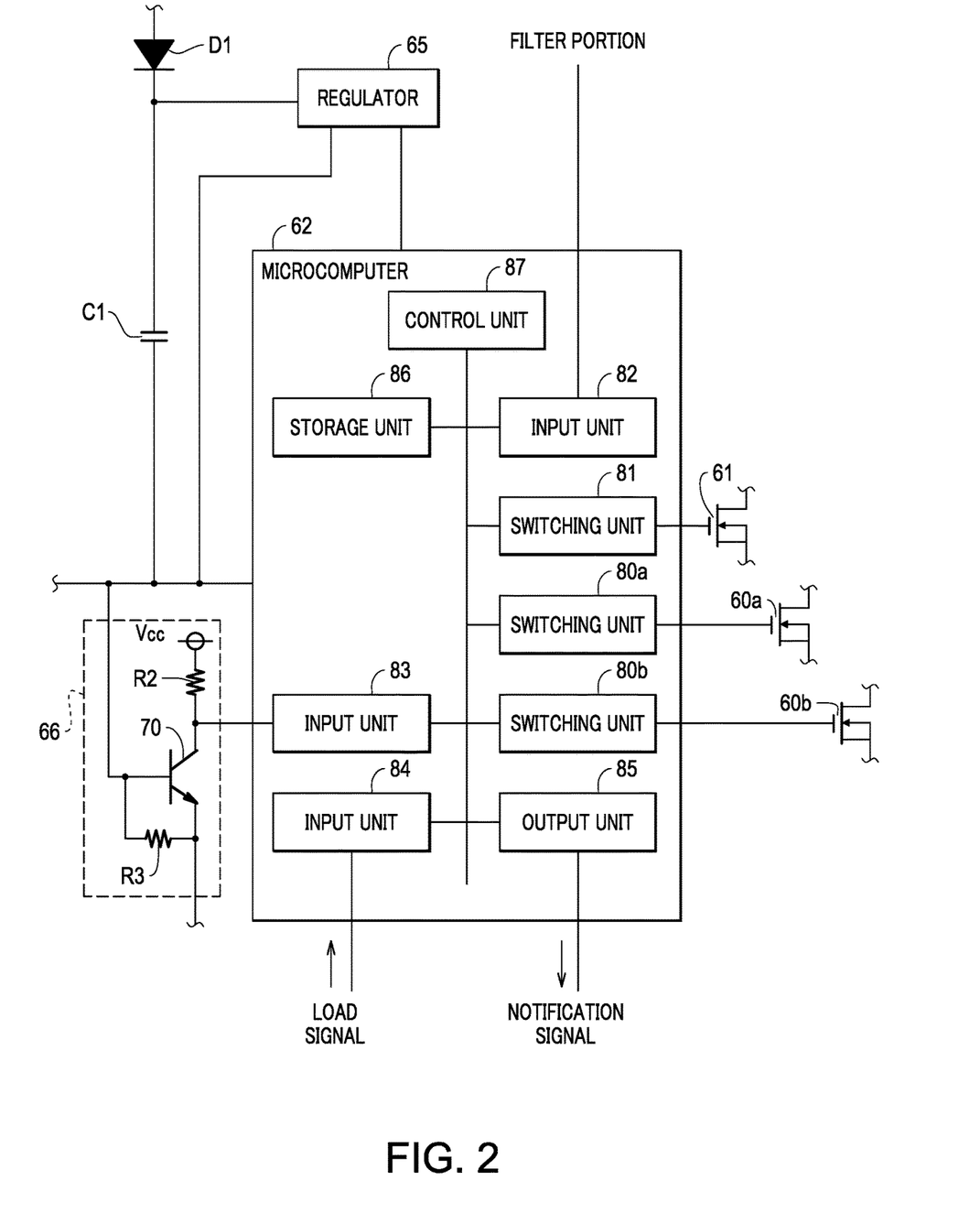
FIG. 2 is a block diagram showing the configuration of the main portions of a microcomputer.

FIG. 2 is a block diagram showing the configuration of the main portions of the microcomputer 62. The microcomputer 62 has switching units 80*a*, 80*b*, and 81, input units 82, 83, and 84, an output unit 85, a storage unit 86, and a control unit 87. These units are connected to a bus 88 and operate using power that is supplied by the regulator 65. The switching units 80*a*, 80*b*, and 81 are further connected to the gates of the first switches 60*a* and 60*b* and the second switch 61. The input unit 82 is further connected to the filter portion 64. The input unit 84 and the output unit 85 are further connected respectively to the signal terminals 54 and 55.

The switching units 80*a*, 80*b*, and 81 respectively switch the first switches 60*a* and 60*b* and the second switch 61 on and off by adjusting the voltages at the gates of the first switches 60*a* and 60*b* and the second switch 61. The switching units 80*a*, 80*b*, and 81 respectively switch the first switches 60*a* and 60*b* and the second switch 61 on and off in accordance with the instruction received from the control unit 87.

The input unit 82 receives a high-level voltage and a low-level voltage is input from the filter portion 64. The input unit 82 communicates the voltage that is received from the filter portion 64 to the control unit 87.

The input unit 83 receives a voltage from the other end of the resistor R2 of the opening detection circuit 66. The input unit 83 communicates the voltage that is input from the opening detection circuit 66 to the control unit 87.

The input unit 84 receives a load signal from the signal terminal 54. The input unit 84 communicates the content of the load signal that is received from the signal terminal 54 to the control unit 87.

The output unit 85 outputs a notification signal that indicates the opening of the GND terminal 53 to the outside via the signal terminal 55, in accordance with the instruction received from the control unit 87.

The storage unit 86 is a non-volatile memory. Information indicating the above-described reference voltage and control programs are stored in the storage unit 86.

The control unit 87 has a CPU (Central Processing Unit) (not shown), and executes power supply control processing for controlling the supply of power to the first loads 3a and 3b and the second load 4, off-processing for switching off the second switch 61, and restriction processing for restricting the load to which power can be supplied, by executing the control programs stored in the storage unit 86.

A flag is stored in the storage unit 86. When the flag value is zero, the loads to which power can be supplied are the first loads 3a and 3b and the second load 4. When the flag value is one, the loads to which power can be supplied are the first loads 3a and 3b, and the supply of power to the second load 4 is prohibited. The flag values stored in the storage unit 86 are set by the control unit 87.

Figure 3:
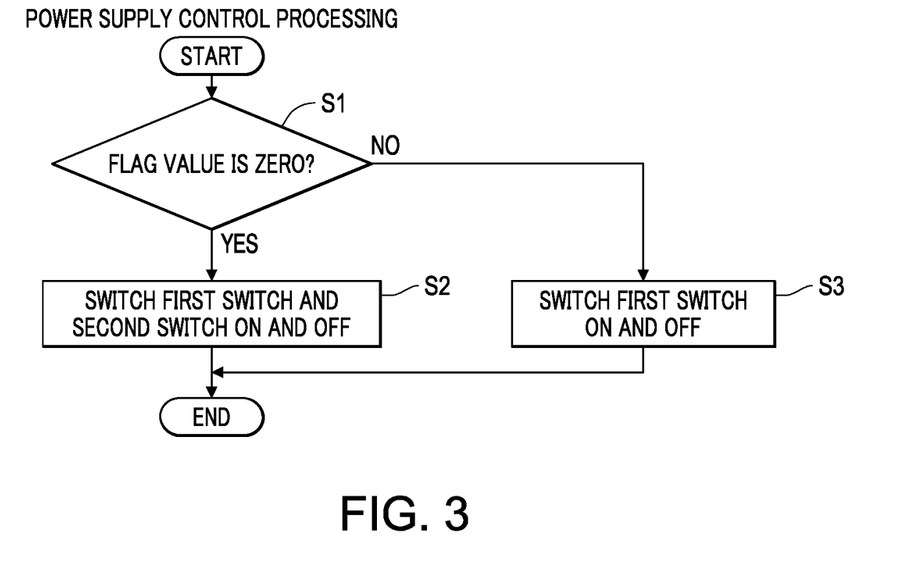
FIG. 3 is a flowchart showing a procedure of power supply control processing executed by a control unit.

FIG. 3 is a flowchart showing a procedure of the power supply control processing executed by the control unit 87. If a load signal is input to the input unit 84, the control unit 87 executes the power supply control processing via the signal terminal 54. First, the control unit 87 determines whether or not the flag value stored in the storage unit 86 is zero (step S1). If the control unit 87 determines that the flag value is zero (step S1: YES), the control unit 87 causes the switching units 80a, 80b, and 81 to respectively switch the first switches 60a and 60b and the second switch 61 on and off, based on the content of the load signal that has been input to the input unit 84 (step S2).

The first loads 3a and 3b and the second load 4 respectively correspond to the first switches 60a and 60b and the second switch 61. In step S2, the control unit 87 causes a switch out of the first switches 60a and 60b and the second switch 61 that corresponds to the operation load indicated by the load signal to be switched on. Furthermore, the control unit 87 causes a switch out of the first switches 60a and 60b and the second switch 61 that corresponds to the stop load indicated by the load signal to be switched off.

For example, if the load signal indicates the first load 3a and the second load 4 as the operation loads and indicates the first load 3b as the stop load, the control unit 87 instructs the switching units 80a, 80b, and 81 to switch on the first switch 60a, switch off the first switch 60b, and switch on the second switch 61. Accordingly, power is supplied by the battery 2 to the first load 3a and the second load 4 and the first load 3a and the second load 4 operate, and the supply of power from the battery 2 to the first load 3b is stopped and the first load 3b stops operating.

If the control unit 87 determines that the flag value is not zero, that is, determines that the flag value is one (step S1: NO), the control unit 87 causes the switching units 80a and 80b to respectively switch the first switches 60a and 60b on and off (step S3) based on the content of the load signal received by the input unit 84. Even though, in step S3, the load signal that is input to the input unit 84 indicates the second load 4 as the operation load, for example, the control unit 87 does not cause the switching unit 81 to switch on the second switch 61.

In the restriction processing, the control unit 87 sets the flag value to one in a state in which the second switch 61 is off. Thus, if the flag value is one, the second switch 61 is kept off.

After executing either one of steps S2 and S3, the control unit 87 ends the power supply control processing.

If a low-level voltage is input to the input unit 82 from the filter portion 64, that is, if a state in which the voltage detected by the voltage detection circuit 63 is less than the threshold value continues for at least a predetermined period of time, the control unit 87 executes the off-processing. In the off-processing, the control unit 87 instructs the switching unit 81 to switch off the second switch 61. After switching off the second switch 61, the control unit 87 ends the off-processing. By the control unit 87 executing the off-processing, the opening detection circuit 66 can operate.

Figure 4:
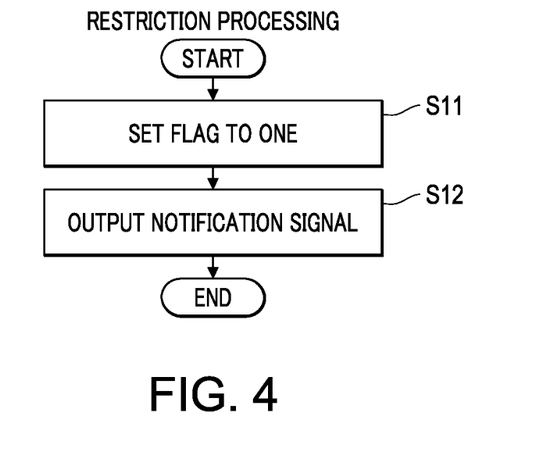
FIG. 4 is a flowchart showing a procedure of restriction processing executed by the control unit.

FIG. 4 is a flowchart showing a procedure of the restriction processing executed by the control unit 87. If the opening detection circuit 66 detects the opening of the GND terminal 53, that is, if the voltage that is input to the input unit 83 from the opening detection circuit 66 is less than the reference voltage, the control unit 87 executes the restriction processing. Operation of the opening detection circuit 66 means that the second switch 61 is off, and thus the restriction processing is executed in a state in which the second switch 61 is off.

In the restriction processing, the control unit 87 sets the flag value that is stored in the storage unit 86 to one (step S11). Accordingly, the second switch 61 is not switched on in the power supply control processing, and the second switch 61 is kept off. After executing step S11, the control unit 87 instructs the output unit 85 to output a notification signal (step S12). The notification signal is input to a notification apparatus (not shown). If the notification apparatus receives the notification signal, the notification apparatus displays a message or lights a lamp, for example, and the notification apparatus notifies the opening of the GND terminal 53. After executing step S12, the control unit 87 ends the restriction processing.

Figure 5:
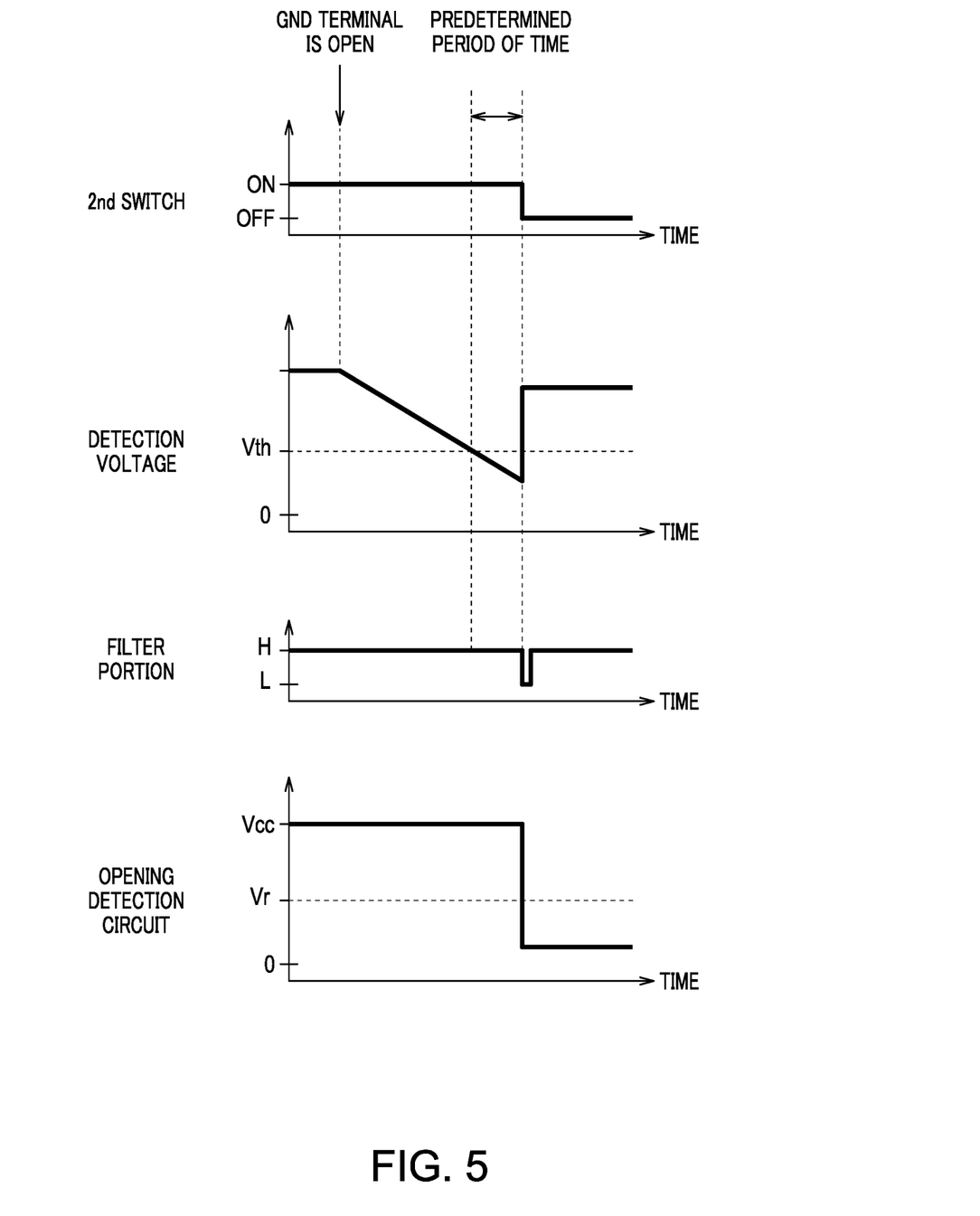
FIG. 5 is a timing chart showing one example of operations of the power supply control device.

FIG. 5 is a timing chart showing one example of operations of the power supply control device 5. FIG. 5 shows the transition between the on and off states of the second switch 61, the transition between detection voltages detected by the voltage detection circuit 63, the transition between voltages that are output from the filter portion 64 to the microcomputer 62, and the transition between voltages that are output from the opening detection circuit 66 to the microcomputer 62. A horizontal axis of the transition represents time. In FIG. 5, "H" represents a high-level voltage and "L" represents a low-level voltage. Also, in FIG. 5, Vth and Vr are respectively the above-described threshold value and reference voltage.

If the GND terminal 53 is grounded, the detection voltage, that is, the voltage between the battery terminal 50 and the GND terminal 53 approximately coincides with the voltage output from the battery 2, and is at least the threshold value Vth. Thus, if the GND terminal 53 is grounded, the voltage detection circuit 63 outputs a high-level voltage to the filter portion 64, and the filter portion 64 outputs a high-level voltage to the input unit 82 of the microcomputer 62.

As described above, if the GND terminal 53 is grounded, or if the second switch 61 is on, the opening detection circuit 66 outputs a predetermined voltage Vcc to the input unit 83 of the microcomputer 62. As described above, the predetermined voltage Vcc is at least the reference voltage Vr.

As described above, if the GND terminal 53 is opened in a state in which the second switch 61 is on, the supply of power from the battery 2 to the microcomputer 62 and the capacitor C1 is stopped, and the capacitor C1 discharges in order to supply power to the regulator 65 and the microcomputer 62. The regulator 65 and the microcomputer 62 continues to operate due to supply of power from the capacitor C1 to the regulator 65 and the microcomputer 62.

Thus, even though the GND terminal 53 is opened in a state in which the second switch 61 is on, the microcomputer 62 can continuously switch the first switches 60a and 60b and the second switch 61 on and off.

The potential of the GND terminal 53 increases and the voltage between two ends of the capacitor C1 decreases in response to the discharge of the capacitor C1. Accordingly, the voltage between the battery terminal 50 and the GND terminal 53, that is, the detection voltage detected by the voltage detection circuit 63 also decreases. As described above, even though the GND terminal 53 is opened, when the second switch 61 is on, the opening detection circuit 66 outputs the predetermined voltage Vcc to the input unit 83 of the microcomputer 62.

If the detection voltage is less than the threshold value Vth, the voltage detection circuit 63 switches the voltage output to the filter portion 64 from a high-level voltage to a low-level voltage. Moreover, if the state in which the voltage detection circuit 63 outputs a low-level voltage to the filter portion 64 continues for a predetermined period of time, the filter portion 64 switches the voltage that is output to the input unit 82 of the microcomputer 62 from a high-level voltage to a low-level voltage. At this time, the control unit 87 executes the off-processing, and the control unit 87 causes the switching unit 81 to switch off the second switch 61 in the off-processing.

If the second switch 61 is switched off, the GND terminal 53 is open, and thus, as described above, the supply of power from the battery 2 to the microcomputer 62 and the capacitor C1 is resumed. At this time, current that is output from the microcomputer 62 and the capacitor C1 flows through the resistor R3, the diode D2, the second load terminal 52, and the resistor R1 of the second load 4 in this order. When voltage across the resistor R3 drops, the third switch 70 is turned on, and the opening detection circuit 66 switches the voltage that is output to the input unit 83 of the microcomputer 62 from the predetermined voltage Vcc to a voltage that is less than the reference voltage Vr.

As described above, if the opening detection circuit 66 detects the opening of the GND terminal 53 and the input unit 83 of the microcomputer 62 receives a voltage that is less than the reference voltage Vr, the control unit 87 executes the restriction processing. In the restriction processing, the flag value is set to one, and a notification signal is output from the output unit 85. Because the flag value is set to one, the second switch 61 is not switched on in the power supply control processing after the flag value was set to one, and the second switch 61 is kept off. Also, the output unit 85 outputs a notification signal, and thereby, notification is given of the opening of the GND terminal 53.

As described above, if the supply of power from the battery 2 to the microcomputer 62 and the capacitor C1 is resumed, the detection voltage detected by the voltage detection circuit 63 returns to a voltage that is at least the threshold value Vth. However, after flowing through the resistor R3, the diode D2, and the resistor R1, current returns to the negative electrode of the battery 2, and thus, the detection voltage is lower than the voltage output from the battery 2 by the voltage drop across the resistor R3, the diode D2, and the resistor R1.

If the detection voltage returns to a voltage that is at least the threshold value Vth, the voltage that is output from the voltage detection circuit 63 to the filter portion 64 returns from a low-level voltage to a high-level voltage, and thus the voltage that is output from the filter portion 64 to the input unit 82 of the microcomputer 62 also returns from a low-level voltage to a high-level voltage.

Note that if the off-processing is executed in a state in which the GND terminal 53 is grounded, for example, if the off-processing is executed due to a decrease in the voltage that is output from the battery 2, the opening detection circuit 66 does not detect the opening of the GND terminal 53 and the restriction processing is not executed. Thus, even though the off-processing is executed, the second switch 61 is switched on by the switching unit 81 in the power supply control processing.

Figure 6:
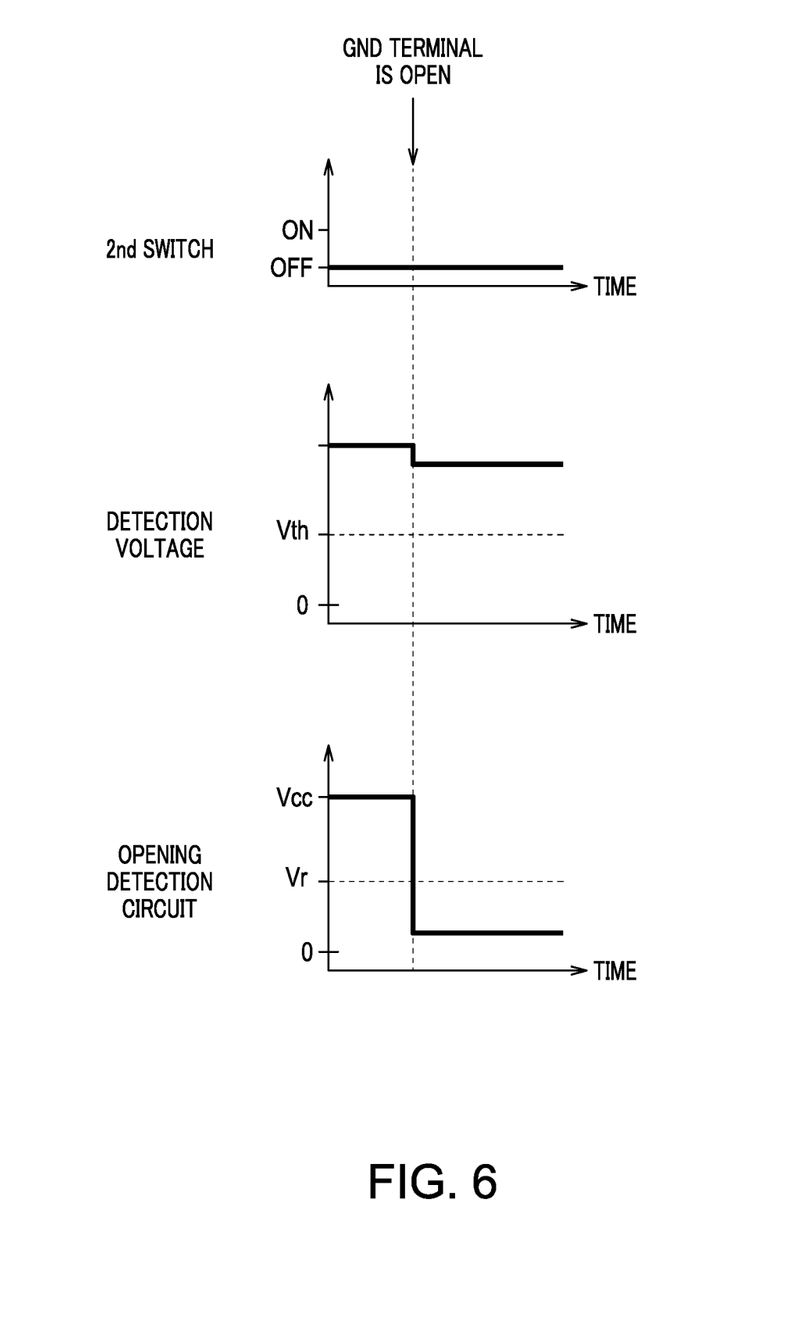
FIG. 6 is a timing chart showing another example of operations of the power supply control device.

FIG. 6 is a timing chart showing another example of the operations of the power supply control device 5. FIG. 6 shows the transition between the on and off states of the second switch 61, the transition between detection voltages detected by the voltage detection circuit 63, and the transition between voltages that are output from the opening detection circuit 66 to the microcomputer 62. A horizontal axis of the transition represents time.

As described above, if the GND terminal 53 is grounded, the detection voltage detected by the voltage detection circuit 63 is at least the threshold value Vth, and the opening detection circuit 66 outputs the predetermined voltage Vcc to the input unit 83 of the microcomputer 62.

If the GND terminal 53 is opened in a state in which the second switch 61 is off, power supply paths through which power is supplied from the battery 2 to the microcomputer 62 and the capacitor C1 are modified, and current flows through the resistor R3 of the opening detection circuit 66, the diode D2, the second load terminal 52, and the resistor R1 of the second load 4 in this order. When the voltage across the resistor R3 drops, the third switch 70 is switched on from off, and the voltage that is output from the opening detection circuit 66 to the input unit 83 of the microcomputer 62 is switched from the predetermined voltage Vcc to a voltage that is less than the reference voltage Vr.

As described above, if the opening detection circuit 66 detects the opening of the GND terminal 53 and the input unit 83 of the microcomputer 62 receives a voltage that is less than the reference voltage Vr, the control unit 87 executes the restriction processing. In the restriction processing, the flag value is set to one, and a notification signal is output from the output unit 85. Because the flag value is set to one, the second switch 61 is not switched off in the power supply control processing after the flag value was set to one, and the second switch 61 is kept off. Also, the output unit 85 outputs a notification signal, and thereby, notification is given of the opening of the GND terminal 53.

After the power supply paths through which power is supplied from the battery 2 to the microcomputer 62 and the capacitor C1 are modified, the detection voltage detected by the voltage detection circuit 63 is also kept at least the threshold value Vth. However, after flowing through the resistor R3, the diode D2, and the resistor R1, current returns to the negative electrode of the battery 2, and thus, the detection voltage is lower than the voltage output from the battery 2 by a voltage drop across the resistor R3, the diode D2, and the resistor R1.

In the power supply control device 5 configured as described above, the microcomputer 62 sets the flag value to one and keeps the second switch 61 off at an appropriate time at which the opening detection circuit 66 detects the opening of the GND terminal 53. Thereafter, in the power supply control processing, the microcomputer 62 switches the first switches 60a and 60b on and off in a state in which the second switch 61 is kept off, and controls the supply of power from the battery 2 to the first loads 3a and 3b.

Also, if the voltage detection circuit 63 continuously detects a voltage that is less than the threshold value Vth for a predetermined period of time, that is, if there is a high probability that the GND terminal 53 is open, the filter portion 64 outputs a low-level voltage to the input unit 82 of the microcomputer 62, the microcomputer 62 switches off the second switch 61 and stops the supply of power from the battery 2 to the second load 4. Accordingly, the microcomputer 62 more appropriately controls the supply of power from the battery 2 to the second load 4.

Also, the voltage detection circuit 63 may output a high-level voltage or a low-level voltage to the input unit 82 of the microcomputer 62 instead of the filter portion 64. In this case, immediately after the voltage that is output from the voltage detection circuit 63 is switched from a high-level voltage to a low-level voltage, that is, immediately after the detection voltage is less than the threshold value Vth, the control unit 87 of the microcomputer 62 executes the off-processing, and the switching unit 81 switches off the second switch 61.

The opening detection circuit 66 is not limited to a circuit constituted by the third switch 70, the resistors R2 and R3, and may also have a configuration in which the opening of the GND terminal 53 can be detected. If the opening detection circuit 66 is configured to operate independently of the on/off states of the second switch 61, the power supply control device 5 may not have the voltage detection circuit 63 and the filter portion 64. In this case, in the restriction processing, the control unit 87 of the microcomputer 62 sets the flag value to one and instructs the switching unit 81 to switch off the second switch 61.

The first switches 60a and 60b and the second switch 61 are not limited to an N-channel FET, and may also be a P-channel FET, a bipolar transistor, or the like. Also, the number of first switches, that is, the number of first loads, is not limited to two, and may also be one or at least three. In this case as well, the power supply control device 5 exhibits an effect that is similar to that of the case where the number of first switches is two.

Also, the capacitor C1 may have both the function of accumulating power supplied by the battery 2 and the function of supplying power to the regulator 65 and the microcomputer 62 when the GND terminal 53 is opened. Thus, a battery may also be used instead of the capacitor C1. Furthermore, the second load 4 is not limited to a load having a resistor, and may also be a load having an inductor, for example.

Embodiments that were disclosed are to be considered exemplary in all respects and in no way limiting.

The invention claimed is:

1. A power supply control device comprising:
a switch control unit that is configured to switch on and off a first switch and a second switch and receives a supply of power from a battery, the first switch and the second switch being respectively provided in a plurality of power supply paths through which power is supplied from one end of a battery to one end of a first load and one end of a second load;
an output terminal from which current that flows from the battery via the switch control unit is output;
a diode whose anode is connected to the output terminal, and whose cathode is connected to one end of the second load;
an opening detection circuit configured to not detect opening of the output terminal if the second switch is on, and configured to operate if the second switch is off and detect opening of the output terminal; and
a voltage detection circuit configured to detect a voltage between one end of the battery and the output terminal, wherein the switch control unit
switches off the second switch if the voltage detected by the voltage detection circuit is less than a threshold value, and
keeps the second switch off if the opening detection circuit detects the opening.

2. The power supply control device according to claim 1, wherein the opening detection circuit has:
a resistor having one end to which a predetermined voltage is applied; and
a third switch that is connected between another end of the resistor and the anode of the diode, and that is switched on from off if current flows through the diode, and
a voltage is output from the other end of the resistor to the switch control unit.

3. The power supply control device according to claim 2, wherein, if the opening is not detected, a voltage that is at least a second predetermined voltage is output to the switch control unit from the other end of the resistor of the opening detection circuit, and
if the opening is detected, a voltage that is less than the second predetermined voltage is output to the switch control unit from the other end of the resistor of the opening detection circuit.

4. The power supply control device according to claim 1 or 2,
wherein, if a state in which the voltage detected by the voltage detection circuit is less than the threshold value continues for at least a predetermined period of time, then the switch control unit switches off the second switch.

5. The power supply control device according to any one of claims 1, 2, and 4, comprising:
an accumulator configured to accumulate power supplied by the battery,
wherein, if the output terminal is opened in a state in which the second switch is on, then the accumulator supplies power to the switch control unit.

6. The power supply control device according to any one of claims 1 to 2, and 3,
wherein after the opening detection circuit detects the opening, the switch control unit switches the first switch on and off in a state in which the second switch is kept off.

* * * * *